United States Patent [19]
Weigand et al.

[11] Patent Number: 5,992,046
[45] Date of Patent: Nov. 30, 1999

[54] SEMICONDUCTOR WAFER TEMPERATURE MEASUREMENT AND CONTROL THEREOF USING GAS TEMPERATURE MEASUREMENT

[75] Inventors: Peter Weigand, Unterhaching, Germany; Naohiro Shoda, Gainsville, Va.

[73] Assignees: Siemens Aktiengesellschaft, Munich, Germany; Kabushiki Kaisha Toshiba, Kanagawa-ken, Japan

[21] Appl. No.: 09/251,611

[22] Filed: Feb. 17, 1999

Related U.S. Application Data

[62] Division of application No. 08/929,711, Sep. 15, 1997.
[51] Int. Cl.[6] ................................................. G26D 3/00
[52] U.S. Cl. ................................................. 34/493; 34/497
[58] Field of Search ..................... 34/407, 416, 428, 34/433, 493, 497, 510, 58, 92, 565, 107, 192, 210; 118/724, 725, 728

[56] References Cited

U.S. PATENT DOCUMENTS

| | | | |
|---|---|---|---|
| 5,231,291 | 7/1993 | Amemiya et al. | 250/443.1 |
| 5,325,604 | 7/1994 | Little | 34/493 |
| 5,458,687 | 10/1995 | Shichida et al. | 118/724 |
| 5,609,720 | 3/1997 | Lenz et al. | 156/643.1 |

*Primary Examiner*—Henry Bennett
*Assistant Examiner*—Steve Gravini
*Attorney, Agent, or Firm*—Stanton C. Braden

[57] ABSTRACT

Apparatus and method are provided for obtaining improved measurement and control of the temperature of a semiconductor wafer (W) during processing. The apparatus includes a chuck for holding a wafer during processing, a coolant gas supply (16), and a temperature sensing arrangement for measuring and controlling the temperature of the wafer during processing. A top face of the chuck (22) over which the wafer is positioned, is configured with a plurality of holes (34) into which the coolant gas, such as helium, is admitted at controlled rate and pressure. The coolant gas passes through a narrow space (36) between the top face of the chuck and the underside of the wafer and is evacuated via an exhaust line (30) after being heated to (or nearly to) the temperature of the wafer. Temperature of the now-heated coolant gas is continuously measured by a temperature sensor arrangement which generates a signal controlling the pressure and flow of coolant gas to the wafer. Close control of the temperature of the wafer is thereby maintained continuously at a desired value during processing.

4 Claims, 1 Drawing Sheet

SEMICONDUCTOR WAFER TEMPERATURE MEASUREMENT AND CONTROL THEREOF USING GAS TEMPERATURE MEASUREMENT This is a divisional of application Ser. No. 08/929,711 filed Sep. 15, 1997.

FIELD OF THE INVENTION

This invention relates to measuring and controlling the temperature of a semiconductor wafer during any of various different processes occurring during fabrication of the wafer into integrated circuits with improved accuracy and ease.

BACKGROUND OF THE INVENTION

The steps in processing semiconductor wafers into individual integrated circuits (ICs) are well known in the art. In one widely used manufacturing method a semiconductor wafer (typically six or eight inches in diameter) is chemically and photographically processed through a number of steps to produce a multitude of very closely spaced and precisely detailed ICs on the wafer. In such processing, a wafer may be exposed within a reactor to a highly active plasma of special gas or gases in order to etch, by means of reactive ions of the gases, very fine details (lines, zones, etc.) into a top surface of a wafer being processed. The wafer is subsequently cut into individual ICs. This general technology is well known in the art and need not be described further.

A typical IC processing apparatus comprises a reactor in which there is a chamber through which reactive gas or gases are flowed, a support such as a chuck or pedestal for holding one or more wafers in proper position in the chamber to expose a top surface of the wafer to the reactive gas.

By way of example, during etching in a typical plasma etching operation, the reactive ions of the plasma gas chemically react with portions of material on a face of the semiconductor wafer. This process is exothermic and causes some degree of heating of the wafer. The chemical reaction between gas (ions and radicals) and wafer material, on the other hand, is accelerated to some degree by the temperature rise of the wafer. Wafer temperature and the rate of chemical reaction are related to an extent that harmful over-etching (or under-etching) of material over a face of the wafer can easily result if the temperature of the wafer varies too much from a desired value. It is highly desirable therefore that wafer temperature be accurately controlled with respect to a given process [e.g., reactive ion etching (RIE)] since otherwise the IC's being fabricated on the wafer will have electronic characteristics which deviate from their design center more than is desirable.

The problem of temperature rise of a wafer during IC processing is well known. One effective way to control wafer temperature to a desired value is to flow coolant gas (such as helium) at a suitable pressure and flow rate within and through a thin space between the bottom of the wafer and the top of the chuck or pedestal which holds the wafer. However, there are certain difficulties in measuring the temperature of the wafer during processing. To put a temperature probe, such as a thermocouple, in actual contact with the wafer can cause distortion in the temperature distribution over the wafer itself and this in turn affects measurement accuracy as well as the processing of the wafer. On the other hand, remote sensing of the temperature of the wafer by infrared (IR) scanner is complicated by the fact that the wafer, being a thin piece of essentially pure silicon, is transparent to certain wavelengths of infrared light (much as an ordinary glass window is transparent to visible light). An IR sensor therefore "sees" not only the wafer temperature but that of the chuck on which it is mounted and also possibly background temperature of the walls of the reaction chamber within which the wafer is being processed. This makes it necessary to carefully calibrate the IR sensor with respect to the heat emissivity of a wafer being processed as well as that of the chuck and possibly also the inside walls of the reaction chamber.

From the above discussion, it is desirable to provide easy and accurate measurement and control of the temperature of a wafer during processing.

SUMMARY OF THE INVENTION

In accordance with one aspect of the invention, apparatus is provided including a chuck, a coolant gas supply and a temperature sensing arrangement for measuring and for controlling the temperature of a wafer to a desired value during processing. A top face of the chuck (either mechanical or electrostatic), against which the wafer is positioned, is configured with a plurality of holes into which coolant gas, such as helium, is admitted via an entrance line at a controlled rate and pressure. The coolant gas passes through a narrow space between the top face of the chuck and the underside of the wafer and is evacuated through another hole into an exhaust line after being heated to (or nearly to) the temperature of the wafer. The amount of heat transferred from the wafer into the coolant gas is controlled by setting the pressure and flow of coolant gas and this in turn controls the temperature of the wafer. Optionally, the temperature of the coolant gas can also be controlled. Immediately after being evacuated from beneath the wafer, the now-heated coolant gas is passed, via the exhaust line, over a temperature sensor placed within that line. This sensor measures the temperature of the now-heated coolant gas, and thus, within a predictable offset of a few degrees centigrade, the actual temperature of the wafer itself. A continuous signal from the temperature sensor is fed to an electronic temperature monitor which generates a suitable control signal. This control signal in turn is fed back to the coolant gas supply to control the flow of cool coolant gas into the entrance line and thence into the space beneath the wafer being processed. In this way close control of the temperature of the wafer is maintained continuously at a desired value during processing.

In one aspect the present invention is directed to temperature control apparatus for controlling the temperature of a workpiece. The temperature control apparatus comprises a gas supply, a temperature sensor, a temperature controller, and control means. The gas supply is capable of supplying gas at a selected temperature, pressure, and flow rate which flows over the workpiece and experiences an energy transfer as a result thereof. The temperature sensor measures the temperature of the gas after same contacts the workpiece and generates an output signal indicative of the temperature of the gas after same contacts the workpiece. The temperature controller, which is responsive to the output signal of the temperature sensor, generates a control signal indicative of a desired change in the temperature of the workpiece. The control means is coupled to the gas supply and responsive to the control signal of the temperature controller and controls at least one of the temperature, pressure, and flow rate of the gas before same contacts the workpiece so as to regulate the temperature of the workpiece.

In an other aspect the present invention is directed to a method for controlling the temperature of a workpiece during processing. The method comprises a first step of flowing gas over the workpiece to cause a transfer of energy between the workpiece and the gas; a second step of measuring the temperature of the gas after same passes the workpiece; and a third step of using the temperature of the gas after same passes the workpiece to control at least one of the temperature, pressure, and flow of the gas to the workpiece such that the temperature of the workpiece during processing is adjusted to within a desired temperature range.

A better understanding of the invention will be gained from a study of the following description given in conjunction with the accompanying drawing and claims.

DETAILED DESCRIPTION

Figure 1:
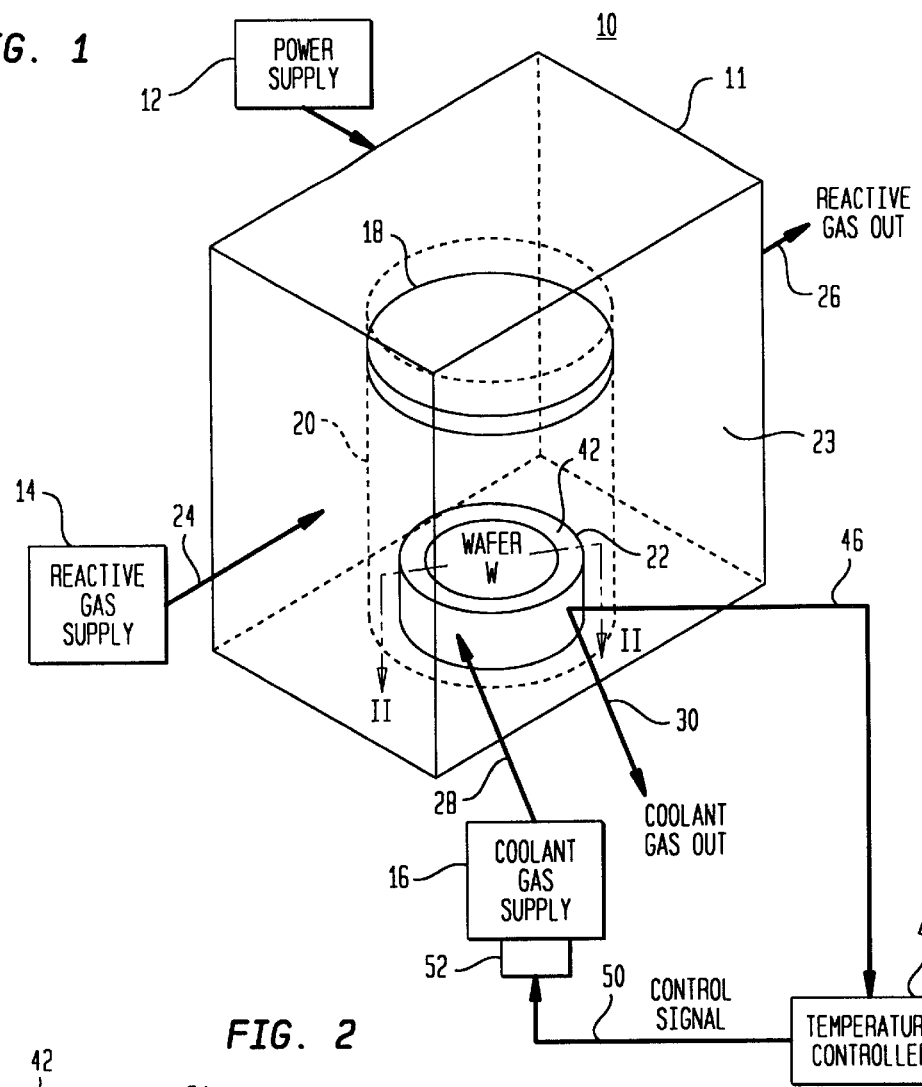
FIG. 1 is a schematic representation, by way of example, of reactor apparatus for RIE and similar processing of semiconductor wafers, the reactor having therein a wafer-holding chuck with improved temperature control apparatus provided in accordance with the present invention.

Referring now to FIG. 1, there is shown schematically a reactor apparatus 10 for processing workpieces such as a semiconductor wafers W utilizing features of the present invention. One common process with which apparatus 10 is useful is, for example, reactive ion etching (RIE) of semiconductor wafers. The invention however is not limited to RIE processing, and may also be utilized with different processes requiring different temperatures of the wafers (work pieces) being processed.

The apparatus 10 is shown with a semiconductor wafer W therein. Reactors that processes a plurality of wafers are also useful. Certain basic elements of reactor apparatus 10 are shown schematically (or not at all) and the general structure and operation of the reactor apparatus 10 may be similar to certain ones commercially available.

Illustratively, the reactor apparatus 10 comprises a housing 11, a power supply 12, a reactive gas supply 14, a coolant gas supply 16 with a control valve 52, a top electrode 18, a plasma confinement chamber 20 (shown in dashed outline), a support (pedestal) 22, a temperature sensor 44 (shown only in FIG. 2), and a temperature controller 48 in accordance with the present invention, for measuring and for controlling the temperature of a wafer W during processing.

As shown, the support 22 holds the wafer W. The support can be any type of chuck (also sometimes called suseptors) known in the art for supporting a wafer. In one embodiment the chuck also serves as a bottom electrode, which in conjunction with the top electrode 18 during RIE processing of the wafer W generates a plasma (not shown) within the chamber 20. A top surface 54 of the wafer W is held next to a lip (top) portion 42 of the chuck 22. Reactive gas or gases, at controlled pressure, temperature, and flow rate, are introduced into the housing 11 from the reactive gas supply 14 via a line 24 and the gases are exhausted (removed) from housing 11 via a line 26. Coolant gas, typically used at ambient temperature (e.g., 20° C.) and with controlled pressure and flow rate, is applied from the coolant gas supply 16 to the chuck 22 and wafer W via an entrance (supply) line 28 and is bled from the chuck 22 and wafer W via a vacuum or exhaust line 30.

In one embodiment, a temperature sensor 44 (not shown in FIG. 1 but shown in FIG. 2), is located in exhaust line 30 and measures the temperature of the now heated coolant gas after it passes wafer W and is exhausted into exhaust line 30. An output of temperature sensor 44 is coupled via a lead 46 to an input of the temperature controller 48 which generates at an output thereof a control signal. The control signal is coupled via a lead 50 to an input of the control valve 52 of coolant gas supply 16.

Figure 2:
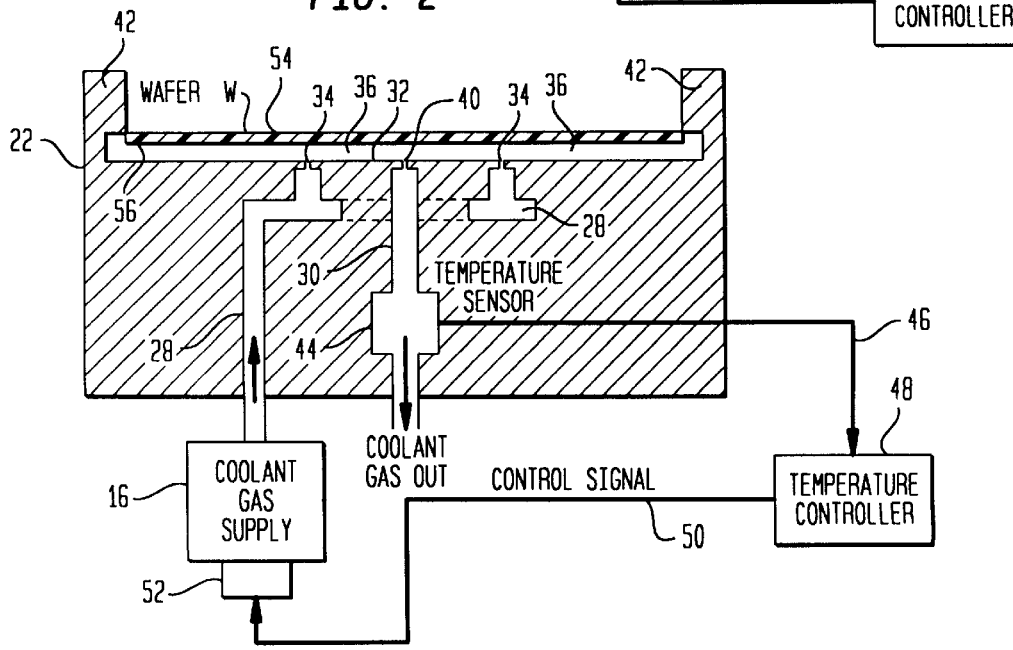
FIG. 2 is an enlarged schematic cross-sectional view through a dashed line II—II of FIG. 1 and shows other components of FIG. 1 in accordance with the present invention.

Referring now to FIG. 2, there is shown in a somewhat enlarged schematic cross-sectional view through a dashed line II—II of the chuck 22 of FIG. 1, the coolant gas supply 16 with the control valve 52, the temperature controller 48, the temperature sensor 44, and the wafer W. Chuck 22 comprises the lip (top) portion 42, a top face portion 32, and a plurality of coolant gas orifices (holes, apertures) generally indicated at 34, angularly spaced apart in the top face 32 of the chuck 22. These orifices 34 are fed with coolant gas via the entrance line 28. Coolant gas flows from these orifices 34 into a thin space (channel) 36 beneath a bottom surface 56 of the wafer W and the chuck face portion 32. The lip portion 42 of chuck 22 holds the top surface 56 of wafer W there against. The channel 36 separates a bottom surface 56 of wafer W from the top face portion 58 of chuck 22. Wafer W is heated as a result of the semiconductor processing being applied thereto. The coolant gas, after being heated by the wafer W, is exhausted from the channel 36 via an orifice (hole, aperture) 40 via the exhaust line 30.

Illustratively, the wafer W is clamped in place opposite the top face 32 of the chuck 22 by the circular lip 42 engaging the wafer W around its rim and applying a suitable holding force. The face 32 of the chuck 22 is approximately the same diameter as that of the wafer W. By way of a typical example, the diameter of the face 32 of the chuck 22 is about 8 inches and is made of polished, anodized aluminum. While clamped opposite the chuck 22, the bottom side 56 of the wafer W is thus in close proximity with the top face portion 32 of the chuck 22. As so positioned, the top surface 54 of the wafer W is exposed during processing to the reactive ion plasma (not shown) within the chamber 20 between the top electrode 18 and the chuck 22, which also serves as the bottom electrode.

The temperature sensor 44 is located within the coolant gas exhaust line 30 and closely adjacent the exit hole 40 beneath the wafer W. Temperature sensor 44 may for example be a thermocouple which produces an electric signal proportional to the temperature of the coolant gas flowing over and past it via the exhaust line 30. The output signal from the sensor 44 is applied via the lead 46 to the temperature controller 48. Temperature controller 48 may for example be a programmable electronic circuit (well known in the art) which can be adjusted to provide an output control signal in accordance with a desired temperature to be maintained by a wafer W during processing. Temperature controller 48 receives the measured temperature of the gas heated by the wafer W from the temperature sensor 44 via the lead 46 and compares that temperature to a desired temperature of the wafer W during processing. It generates at an output thereof a control signal representative of the temperature difference between the measured temperature and the desired wafer W temperature during processing. The now-heated coolant gas flowing over and past the temperature sensor 44 is within a predictable difference of a few degrees centigrade of the actual temperature of the wafer W. The sensor 44 thus provides an accurate measurement of wafer temperature.

The temperature controller 48 applies the output control signal to the lead 50 which is connected to the control valve 52 in the coolant gas supply 16. Control valve 52, in response to the control signal on the lead 50, controls the pressure and flow of coolant gas from the gas supply 16 into the gas entrance line 28. Optionally, control valve 52 also controls the temperature of the gas entering line 28. The temperature of wafer w during processing is adjusted to a desired value by the regulation of the pressure and flow of coolant gas via the line 28. Optionally, the temperature of the gas from gas supply 16 can also be regulated to help adjust the temperature of the wafer W during processing.

By way of example, in one type of process (not RIE), the temperature of a wafer W may be controlled to 400° C. (plus or minus a few degrees centigrade) by the apparatus and method of the present invention. In the RIE process described above, the temperature of the wafer W is typically controlled to about 30° C.

Various modifications in the apparatus and method disclosed may occur to those skilled in the art and can be made without departing from the spirit and scope of the invention as set forth in the accompanying claims. For example, the number or pattern of the coolant gas holes may be changed. Further, coolant gas other than helium may be used and gas pressures, flows and wafer temperature may be as required for a particular wafer process. Moreover, the invention is not limited to a particular process (such as RIE), or to a particular diameter of semiconductor wafer, or to a particular kind of chuck.

What is claimed is:

1. A method for controlling the temperature of a workpiece during processing comprising the steps of:

flowing gas over the workpiece to cause a transfer of energy between the workpiece and the gas;

measuring the temperature of the gas after same passes the workpiece; and using the temperature of the gas after same passes the workpiece to control at least one of the temperature, pressure, and flow of the gas to the workpiece such that the temperature of the workpiece during processing is adjusted to within a desired temperature range.

2. A method of controlling the temperature of a semiconductor wafer during processing thereof which causes a temperature change in the wafer, the method comprising the steps of:

holding the wafer on a chuck in a reaction chamber during processing, the chuck having a lip portion on which the wafer is held and a top face portion which is spaced apart from the wafer, the top face of the chuck defining at least one input aperture therethrough into which coolant gas is admitted and one output apertures through which coolant gas is exhausted;

supplying coolant gas to the input apertures at a controllable pressure and flow rate such that the gas flows past the semiconductor wafer and absorbs heat therefrom;

exhausting the coolant gas from the output apertures;

sensing the temperature of coolant gas as it is exhausted from the output aperture; and controlling parameters of the coolant gas in accordance with the temperature of the exhaust coolant gas such that the temperature of the wafer is controlled during processing.

3. A method for controlling the temperature of a semiconductor wafer during processing comprising the steps of:

passing coolant gas in close proximity to the wafer so as to allow the gas to absorb heat from the wafer;

exhausting heated coolant gas after same contacts the wafer;

measuring the temperature of the exhaust coolant gas;

generating a control signal in accordance with the temperature of the exhaust coolant gas; and using the control signal to control the pressure and flow of coolant gas to the wafer such that the temperature of the wafer during processing is held at a desired value.

4. A method for controlling the temperature of a semiconductor wafer during processing comprising the steps of:

flowing coolant gas against the wafer to absorb heat therefrom;

measuring the temperature of the heated coolant gas after passing from the wafer; and using the temperature of the heated coolant gas to control the pressure and flow of coolant gas to the wafer such that the temperature of the wafer during processing is held substantially constant at a desired value.

* * * * *